United States Patent
Ma et al.

(10) Patent No.: US 10,826,651 B2
(45) Date of Patent: Nov. 3, 2020

(54) DATA SENDING METHOD, DATA RECEIVING METHOD, SENDING DEVICE, AND RECEIVING DEVICE

(71) Applicant: Huawei Technologies Co., Ltd., Shenzhen (CN)

(72) Inventors: Liang Ma, Shanghai (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 51 days.

(21) Appl. No.: 16/183,187

(22) Filed: Nov. 7, 2018

(65) Prior Publication Data
US 2019/0074928 A1 Mar. 7, 2019

Related U.S. Application Data

(63) Continuation of application No. PCT/CN2016/081553, filed on May 10, 2016.

(51) Int. Cl.
*H04L 1/00* (2006.01)
*H03M 13/13* (2006.01)
(Continued)

(52) U.S. Cl.
CPC .......... *H04L 1/0058* (2013.01); *H03M 13/13* (2013.01); *H03M 13/356* (2013.01); *H04L 1/007* (2013.01);
(Continued)

(58) Field of Classification Search
None
See application file for complete search history.

(56) References Cited

U.S. PATENT DOCUMENTS

| 10,439,759 B2* | 10/2019 | Chen | H04L 1/0013 |
| 10,574,401 B2* | 2/2020 | Li | H04L 1/1825 |

(Continued)

FOREIGN PATENT DOCUMENTS

| CN | 1133512 A | 10/1996 |
| CN | 101183918 A | 5/2008 |

(Continued)

OTHER PUBLICATIONS

Hamid Saber, "An Incremental Redundancy Hybrid ARQ Scheme via Puncturing and Extending of Polar Codes," IEEE Transactions on Communications, vol. 63, No. 11, Nov. 2015, 10 pages.
(Continued)

*Primary Examiner* — Phung M Chung
(74) *Attorney, Agent, or Firm* — Slater Matsil, LLP

(57) ABSTRACT

This application provides a data sending method, a data receiving method, a sending device, and a receiving device. The data sending method includes: sending a $1^{st}$ polar-coded code word, where the $1^{st}$ code word includes n $1^{st}$ information bits carrying user data; and sending a $2^{nd}$ polar-coded code word after sending the $1^{st}$ code word is completed, where the $2^{nd}$ code word includes p $2^{nd}$ information bits carrying user data, and each $2^{nd}$ information bit carries same user data as one uniquely corresponding $1^{st}$ retransmission bit. According to the data sending method, the data receiving method, an apparatus, a device, and a system provided in this application, decoding performance of the code words can be improved.

24 Claims, 9 Drawing Sheets

(51) Int. Cl.
*H04L 1/08* (2006.01)
*H04L 1/18* (2006.01)
*H03M 13/35* (2006.01)

(52) U.S. Cl.
CPC .......... *H04L 1/0041* (2013.01); *H04L 1/0045* (2013.01); *H04L 1/08* (2013.01); *H04L 1/1819* (2013.01); *H04L 1/1845* (2013.01); *H04L 1/1893* (2013.01)

(56) References Cited

U.S. PATENT DOCUMENTS

| 2014/0169388 A1 | 6/2014 | Jeong et al. |
| 2015/0381208 A1 | 12/2015 | Li et al. |
| 2017/0012744 A1 | 1/2017 | Shen et al. |

FOREIGN PATENT DOCUMENTS

| CN | 101183919 A | 5/2008 |
| CN | 102122966 A | 7/2011 |
| CN | 102164025 A | 8/2011 |
| CN | 103281166 A | 9/2013 |
| CN | 104038234 A | 9/2014 |
| EP | 3113400 A1 | 1/2017 |
| WO | 2015139316 A1 | 9/2015 |

OTHER PUBLICATIONS

Bin Li, et al., "Capacity-achieving rateless polar codes," Aug. 14, 2015, 14 pages.

Erdal Arikan, "Channel polarization: A method for constructing capacity-achieving codes for symmetric binary-input memoryless channels," 2009, 23 pages.

Mostafa El-Khamy et al.,"HARQ Rate-Compatible Polar Codes for Wireless Channels," 2015, 6 pages.

Huawei, Hisilicon, "Overview of Polar Codes", 3GPP TSG RAN WG1 Meeting #84bis, R1-162161, Busan, Korea, Apr. 11-15, 2016, 8 pages.

Qualcomm Incorporated, 3GPP TSG-RAN WG1 #84b, R1-162211, "Polar codes-HARQ, rate", Apr. 11-15, 2016, Busan, Korea, 2 pages.

\* cited by examiner

DATA SENDING METHOD, DATA RECEIVING METHOD, SENDING DEVICE, AND RECEIVING DEVICE

CROSS-REFERENCE TO RELATED APPLICATIONS

This application is a continuation of International Application No. PCT/CN2016/081553, filed on May 10, 2016, the disclosure of which is hereby incorporated by reference in its entirety.

TECHNICAL FIELD

This application relates to the field of wireless communications, and in particular, to a data sending method, a data receiving method, a sending device, and a receiving device.

BACKGROUND

A polar code is a unique coding scheme so far that can theoretically prove that performance can reach a Shannon limit when a code length approaches to infinity. Compared with a turbo code and a low-density parity-check (LDPC) code that have a random structure, the polar code has a particular code word structure and uses a polarization channel unit for continuous recursive connection, so that channel capacities corresponding to some bits in a code word generated through coding approach to 1 and channel capacities corresponding to other bits in the code word approach to 0. In this way, to-be-transmitted information needs to be placed only in a bit whose channel capacity approaches to 1, and a bit whose channel capacity approaches to 0 is set to a fixed value. In this way, performance approaching the Shannon limit can be implemented.

To cope with unpredictable interference in a channel, in a data transmission process in wireless communications, data needs to be coded to generate a code word, and generally, a hybrid automatic repeat request (HARQ) technology also needs to be used for code word retransmission to improve performance of a wireless communications system. The HARQ technology includes two solutions: chase combining (CC) and incremental redundancy (IR). In the CC solution, a code word for retransmission is completely the same as a code word for initial transmission, there is only one redundancy version, and a receive end performs soft combination on the code word for retransmission and the code word for initial transmission and then performs decoding. In the IR solution, a different incremental redundancy parity bit is included in each retransmission. During decoding, code words received in two transmissions are first combined, and then a combined code word is used as a lower-code-rate code word for decoding. In the IR solution, both an energy gain and a coding gain can be obtained. Therefore, the IR solution is used for HARQ implementation in most actual applications.

When the IR solution is used for HARQ implementation, some bits in a code word may be punctured to generate a code word for initial transmission and a code word for retransmission. To be specific, the code word in use is punctured according to a preset rule, and remaining bits after puncturing is used as the code word for initial transmission and the punctured bits are used as the code word for retransmission. However, when a coding scheme is the polar code, code word puncturing affects polarization channel capacity distribution of a code word. As a result, in a code word for initial transmission generated after puncturing, information is not located in a bit whose channel capacity approaches to 1, and decoding performance of the code word for initial transmission is very poor. If optimal performance of the code word for initial transmission is ensured, a code word obtained by combining punctured bits has poor decoding performance due to a change of distribution of polarization channel capacities.

It can be learned that when an existing HARQ technology is used, code word decoding performance is relatively poor if a code word is coded by using the polar code.

SUMMARY

This application provides a data sending method, a data receiving method, a sending device, and a receiving device, to resolve a problem that when an existing HARQ technology is used, code word decoding performance is relatively poor when a code word is coded by using a polar code.

According to a first aspect, this application provides a data sending method. The method includes: sending a $1^{st}$ polar-coded code word, where the $1^{st}$ code word includes n $1^{st}$ information bits carrying user data, and the $1^{st}$ information bits include first n bits in bits of the $1^{st}$ code word that are sorted by channel capacity in descending order; and sending a $2^{nd}$ polar-coded code word after the $1^{st}$ code word is sent, where the $2^{nd}$ code word includes p $2^{nd}$ information bits carrying user data, each $2^{nd}$ information bit carries same user data as one uniquely corresponding $1^{st}$ retransmission bit, the $2^{nd}$ information bits include first p bits in bits of the $2^{nd}$ code word that are sorted by channel capacity in descending order, the $1^{st}$ retransmission bits include first p bits in the $1^{st}$ information bits sorted by channel capacity in ascending order, n is a positive integer, and p is a positive integer not greater than n.

In this implementation, it can be ensured that channel capacity of all bits used for carrying user data in a code word for initial transmission and a code word for first retransmission are the largest in the code words when a HARQ technology is used for data retransmission. In this way, when a receiving device performs combination and decoding on a code word, both a coding gain and an energy gain can be increased, thereby improving decoding performance of the code word.

With reference to the first aspect, in a first possible implementation of the first aspect, the method further includes: sending an $(i+1)^{th}$ code word after an $i^{th}$ code word is sent, where the $(i+1)^{th}$ code word includes q $(i+1)^{th}$ information bits carrying user data, and each $(i+1)^{th}$ information bit carries same user data as one uniquely corresponding $i^{th}$ retransmission bit; and the $(i+1)^{th}$ information bits include first q bits in bits of the $(i+1)^{th}$ code word that are sorted by channel capacity in descending order, the $i^{th}$ retransmission bits include first q bits in bits that carry user data in an $i^{th}$ combined code word and that are sorted by channel capacity in ascending order, the $i^{th}$ combined code word is generated by combining the $i^{th}$ code word and an $(i-1)^{th}$ combined code word, i=2, 3, ..., k, a $1^{st}$ combined code word is the $1^{st}$ code word, k is a maximum quantity of retransmissions, q is a positive integer not greater than n, and both the $i^{th}$ code word and the $(i+1)^{th}$ code word are polar-coded code words.

In this implementation, it can be ensured that channel capacity of all bits used for carrying user data in each code word for retransmission are the largest in the each code word when a HARQ technology is used for data retransmission. Therefore, sending a code word for initial transmission and a code word for retransmission in such manner increases both a coding gain and an energy gain, and further improves decoding performance of the code words.

With reference to the first possible implementation of the first aspect, in a second possible implementation of the first aspect, a length of the $1^{st}$ code word is equal to that of the $2^{nd}$ code word, and a length of the $(i+1)^{th}$ code word is twice that of the $i^{th}$ code word.

In this implementation, during decoding, a receiving device can easily determine a code rate used for decoding.

With reference to the first possible implementation of the first aspect, in a third possible implementation of the first aspect, each frozen bit in each code word from the $1^{st}$ code word to the $(i+1)^{th}$ code word carries a preset value, and a frozen bit is a bit other than an information bit in the each code word of i+1 code words from the $1^{st}$ code word to the $(i+1)^{th}$ code word.

In this implementation, a receiving device can directly determine a decoding result of a frozen bit in each code word, thereby reducing bits that need to be decoded by the receiving device, and improving decoding efficiency of the receiving device.

With reference to the first possible implementation of the first aspect, in a fourth possible implementation of the first aspect, before the sending an $(i+1)^{th}$ code word, the method further includes: performing channel estimation on an $(i+1)^{th}$ combined code word to obtain polarization channel capacity distribution of the $(i+1)^{th}$ combined code word, where the $(i+1)^{th}$ combined code word is generated by combining i+1 code words from the $(i+1)^{th}$ code word to the $1^{st}$ code word in descending order; selecting, from bits sorted by channel capacity in ascending order in the information bits from $1^{st}$ information bits to $i^{th}$ information bits, first q bits as $i^{th}$ target bits; selecting, from bits of the $(i+1)^{th}$ code word that are sorted by channel capacity in descending order, first q bits as the $(i+1)^{th}$ information bits; copying user data carried in each $i^{th}$ target bit to a corresponding $(i+1)^{th}$ information bit; and setting data carried by each frozen bit in the $(i+1)^{th}$ code word to a preset value, where the each frozen bit in the $(i+1)^{th}$ code word is a bit other than the $(i+1)^{th}$ information bits in the $(i+1)^{th}$ code word.

In this implementation, each code word for retransmission is generated only before the code word is sent. This can prevent a sending device from generating an unnecessary code word for retransmission and reduce a data processing amount of the sending device.

With reference to the first possible implementation of the first aspect, in a fifth possible implementation of the first aspect, before the sending a $1^{st}$ code word, the method further includes: performing channel estimation on a $(k+1)^{th}$ combined code word to obtain polarization channel capacity distribution of the $(k+1)^{th}$ combined code word, where the $(k+1)^{th}$ combined code word is generated by combining k+1 code words from the $(k+1)^{th}$ code word to the $1^{st}$ code word in descending order; writing the user data into n bits with largest channel capacity in the $(k+1)^{th}$ combined code word; successively copying, to target bits corresponding to to-be-copied bits, data carried by the to-be-copied bits in the code words from the $(k+1)^{th}$ code word to the $2^{nd}$ code word, where to-be-copied bits in a $j^{th}$ code word include bits carrying user data in the $j^{th}$ code word, the target bits include bits with largest channel capacity, excluding bits carrying user data, in a $(j-1)^{th}$ combined code word, and j=2, 3, . . . , k+1; and setting data carried by each frozen bit in the $(k+1)^{th}$ combined code word to a preset value, where the each frozen bit in the $(k+1)^{th}$ combined code word is a bit other than the bits carrying the user data in the $(k+1)^{th}$ combined code word.

In this implementation, a sending device can generate all code words for retransmission in advance before sending a code word for initial transmission, thereby improving retransmission efficiency. In addition, in this generation manner, values of p and q are naturally generated, thereby preventing code word decoding performance from being affected by improper values of p and q.

According to a second aspect, this application further provides a data receiving method. The method includes: receiving a $1^{st}$ polar-coded code word, where the $1^{st}$ code word includes $1^{st}$ information bits carrying user data, and the $1^{st}$ information bits include first n bits in bits of the code word that are sorted by channel capacity in descending order; decoding the $1^{st}$ code word by using a $1^{st}$ code rate; receiving a $2^{nd}$ code word if an error occurs in decoding the $1^{st}$ code word, where the $2^{nd}$ code word includes p $2^{nd}$ information bits carrying user data, each $2^{nd}$ information bit carries same user data as one corresponding $1^{st}$ retransmission bit, the $2^{nd}$ information bits includes first p bits in bits of the code word that are sorted by channel capacity in descending order, the $1^{st}$ retransmission bits include first p bits in the $1^{st}$ information bits sorted by channel capacity in ascending order, n is a positive integer, and p is a positive integer not greater than n; decoding a $2^{nd}$ combined code word by using a $2^{nd}$ code rate, where the $2^{nd}$ combined code word is generated by combining the $2^{nd}$ code word and the $1^{st}$ code word, and the $2^{nd}$ code rate is greater than the $1^{st}$ code rate; and obtaining user data from a decoding result obtained by decoding the $2^{nd}$ combined code word.

In this implementation, it can be ensured that channel capacity of all bits used for carrying user data in a code word for initial transmission and a code word for the first retransmission are the largest in the code words when a HARQ technology is used for data retransmission. In this way, when a receiving device performs combination and decoding on a code word, both a coding gain and an energy gain can be increased, thereby improving decoding performance of the code word.

With reference to the second aspect, in a first possible implementation of the second aspect, the method further includes: receiving an $(i+1)^{th}$ code word if an error occurs in decoding an $i^{th}$ code word, where the $(i+1)^{th}$ code word includes q $(i+1)^{th}$ information bits carrying user data, each $(i+1)^{th}$ information bit carries same user data as one corresponding $i^{th}$ retransmission bit, the $(i+1)^{th}$ information bits include first q bits in bits of the code word that are sorted by channel capacity in descending order, the $i^{th}$ retransmission bits include first q bits in bits that carry user data in an $i^{th}$ combined code word and that are sorted by channel capacity in ascending order, the $i^{th}$ combined code word is generated by combining i code words from the $i^{th}$ code word to the $1^{st}$ code word, i=2, 3, . . . , k, k is a maximum quantity of retransmissions, and q is a positive integer not greater than n; decoding an $(i+1)^{th}$ combined code word by using an $(i+1)^{th}$ code rate, where the $(i+1)^{th}$ combined code word is generated by combining i+1 code words from the $(i+1)^{th}$ code word and the $1^{st}$ code word, the $(i+1)^{th}$ code rate is greater than an $i^{th}$ code rate, and the $i^{th}$ code rate is a code rate used for decoding the $i^{th}$ combined code word; and obtaining user data from a decoding result obtained by decoding the $(i+1)^{th}$ combined code word, where both the $i^{th}$ code word and the $(i+1)^{th}$ code word are polar-coded code words.

With reference to the first possible implementation of the second aspect, in a second possible implementation of the second aspect, when a length of the $1^{st}$ code word is equal to that of the $2^{nd}$ code word, and a length of the $(i+1)^{th}$ code word is twice that of the $i^{th}$ code word, the $2^{nd}$ code rate is twice the $1^{st}$ code rate, and the $(i+1)^{th}$ code rate is twice the $i^{th}$ code rate.

With reference to the first or second possible implementation of the second aspect, in a third possible implementation of the second aspect, the decoding an $(i+1)^{th}$ combined code word by using an $(i+1)^{th}$ code rate includes: if a to-be-decoded bit is a $1^{st}$ to-be-decoded bit, determining a decoding result of the $1^{st}$ to-be-decoded bit based on a decoding result of a $2^{nd}$ to-be-decoded bit, where the $1^{st}$ to-be-decoded bit is one of $i^{th}$ information bits, the $2^{nd}$ to-be-decoded bit is one of information bits from the $(i+1)^{th}$ information bits to $(k+1)^{th}$ information bits, and the $1^{st}$ to-be-decoded bit carries same data as the $2^{nd}$ to-be-decoded bit.

With reference to the third possible implementation of the second aspect, in a fourth possible implementation of the second aspect, the determining a decoding result of the $1^{st}$ to-be-decoded bit based on a decoding result of a $2^{nd}$ to-be-decoded bit includes: when a decoding manner used for decoding the $(i+1)^{th}$ combined code word is successive cancellation decoding, using the decoding result of the $2^{nd}$ to-be-decoded bit as the decoding result of the $1^{st}$ to-be-decoded bit.

In this implementation, when successive cancellation decoding is used, a decoding result of a to-be-decoded bit may be determined by using a decoding result of a coded bit, so as to increase a decoding speed.

With reference to the third possible implementation of the second aspect, in a fifth possible implementation of the second aspect, the determining a decoding result of the $1^{st}$ to-be-decoded bit based on a decoding result of a $2^{nd}$ to-be-decoded bit includes: when a decoding manner used for decoding the $(i+1)^{th}$ combined code word is list decoding, selecting same decision branches of a survivor path generated in a process of decoding the $2^{nd}$ to-be-decoded bit, and calculating a branch metric of each same decision branch, to determine the decoding result of the $1^{st}$ to-be-decoded bit.

In this implementation, when list decoding is used for decoding, a decoding result of a to-be-decoded bit may be determined by using decoding information of a coded bit, so as to increase a decoding speed.

According to a third aspect, this application further provides a data sending device. The device includes units configured to perform various method steps in the first aspect and the implementations of the first aspect.

According to a fourth aspect, this application further provides a data receiving device. The device includes units configured to perform various method steps in the second aspect and the implementations of the second aspect.

According to a fifth aspect, this application further provides another data sending device. The device includes a processor and a transceiver. The processor is configured to generate a $1^{st}$ polar-coded code word and a $2^{nd}$ polar-coded code word. The transceiver is configured to send the $2^{nd}$ polar-coded code word after sending the $1^{st}$ code word is completed.

With reference to the fifth aspect, in a first possible implementation of the fifth aspect, the processor is further configured to generate an $(i+1)^{th}$ code word. The transceiver is further configured to send the $(i+1)^{th}$ code word after an $i^{th}$ code word is sent.

According to a sixth aspect, this application further provides another data receiving device. The receiving device includes a processor and a transceiver. The transceiver is configured to receive a $1^{st}$ polar-coded code word, and the processor is configured to decode the $1^{st}$ code word by using a $1^{st}$ code rate. The transceiver is further configured to receive a $2^{nd}$ code word if an error occurs in decoding the $1^{st}$ code word; and the processor is further configured to decode a $2^{nd}$ combined code word by using a $2^{nd}$ code rate, where the $2^{nd}$ combined code word is generated by combining the $2^{nd}$ code word and the $1^{st}$ code word.

With reference to the sixth aspect, in a first possible implementation of the sixth aspect, the transceiver is further configured to receive an $(i+1)^{th}$ code word if an error occurs in decoding an $i^{th}$ code word. The processor is further configured to decode an $(i+1)^{th}$ combined code word by using an $(i+1)^{th}$ code rate, where the $(i+1)^{th}$ combined code word is generated by combining code words from the $(i+1)^{th}$ code word to the $1^{st}$ code word.

According to a seventh aspect, this application further provides a data transmission system. The transmission system may include at least one data sending device provided in the fifth aspect, and at least one data receiving device provided in the sixth aspect.

According to an eighth aspect, this application further provides a storage medium. The storage medium may store a program. When the program is executed, some or all of the method steps in various embodiments of the data sending method or the data receiving method provided in this application can be implemented.

According to the data sending method, the data receiving method, the apparatus, the device, and the system provided in this application, it can be ensured that channel capacity of all bits used for carrying user data in a code word for initial transmission and a code word for retransmission are the largest in the code words when a HARQ technology is used for data retransmission. In this way, when the receiving device performs combination and decoding on a code word, both a coding gain and an energy gain can be increased, thereby improving decoding performance of the code word.

BRIEF DESCRIPTION OF THE DRAWINGS

To describe the technical solutions in this application more clearly, the following briefly describes the accompanying drawings required for describing the embodiments. Apparently, a person of ordinary skill in the art may derive other drawings from these accompanying drawings without creative efforts.

DETAILED DESCRIPTION OF ILLUSTRATIVE EMBODIMENTS

In the embodiments of this application, a sending device and a receiving device may be such wireless communications devices as a base station and a terminal that need to perform data transmission in a wireless transmission manner. User data is data sent by the sending device to the receiving device, and is also data that needs to be received by the receiving device.

In the embodiments of this application, a code word (code word) may be constituted by at least one bit. A channel capacity of a bit in the code word may be a possibility of no error in data carried by the bit in a transmission process of the code word. Usually, a value of the channel capacity may be between 0 and 1. A larger channel capacity of the bit indicates a smaller possibility of a transmission error when the bit is used for user data transmission.

In the embodiments of this application, k may be a maximum quantity of HARQ retransmissions. Generally, k may be a positive integer not less than 1. For example, when the maximum quantity of retransmissions is 1, a value of k is 1; when the maximum quantity of retransmissions is 2, a value of k is 2. In the embodiments of this application, k+1 code words may be used as a group for sending a same group of user data. A $1^{st}$ code word is a code word for initial transmission in a HARQ process, an $i^{th}$ code word is a code word for an $(i-1)^{th}$ retransmission, an $(i+1)^{th}$ code word is a code word for an $i^{th}$ retransmission, and i=2, 3, ..., k.

To facilitate code rate selection of the receiving device for code word decoding, when a length of the $1^{st}$ code word is m bits, a length of a $2^{nd}$ code word may also be m bits. In addition, a length of the $(i+1)^{th}$ code word may be twice that of the $i^{th}$ code word. A value of m may be a positive integer. For example, when the value of m is 8, that is, when the length of the $1^{st}$ code word is 8 bits, the length of the $2^{nd}$ code word may also be 8 bits, and a length of a $3^{rd}$ code word may be 16 bits.

Figure 1:
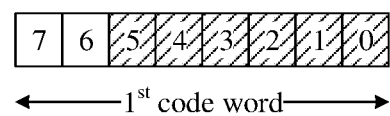
FIG. 1 is a schematic structural diagram of a code word according to this application.

The $1^{st}$ code word may include n $1^{st}$ information bits used for carrying user data, where n is a positive integer not greater than m. For example, when the length of the $1^{st}$ code word is 8 bits, the $1^{st}$ code word may include six $1^{st}$ information bits used for carrying to-be-sent information. As shown in FIG. 1, when bits with largest channel capacity in a $0^{th}$ to a $7^{th}$ bits are the $0^{th}$ to a $5^{th}$ bits, the $1^{st}$ information bits may include the $0^{th}$ to the $5^{th}$ bits.

The $2^{nd}$ code word may include p $2^{nd}$ information bits carrying user data, and each $2^{nd}$ information bit carries same user data as one uniquely corresponding $1^{st}$ retransmission bit. The $2^{nd}$ information bits include first p bits in bits of the $2^{nd}$ code word that are sorted by channel capacity in descending order, the $1^{st}$ retransmission bits include first p bits in the $1^{st}$ information bits sorted by channel capacity in ascending order, and p is a positive integer not greater than n. A value of p may be preset, or may be determined based on a code word generation manner. A channel capacity of each $2^{nd}$ information bit may be greater than that of each $1^{st}$ retransmission bit.

Figure 2:
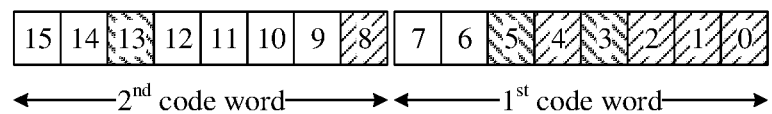
FIG. 2 is another schematic structural diagram of a code word according to this application.

For example, when the value of p is 2, the $2^{nd}$ code word may include two $2^{nd}$ information bits, and the $1^{st}$ information bits also include two retransmission bits. As shown in FIG. 2, if two bits with largest channel capacity in the $2^{nd}$ code word are an $8^{th}$ bit and a $13^{th}$ bit, and two bits with smallest channel capacity in the $1^{st}$ information bits are the $5^{th}$ bit and a $3^{rd}$ bit, the $5^{th}$ bit and the $3^{rd}$ bit are the $1^{st}$ retransmission bits. Therefore, the $13^{th}$ bit may be used as a $2^{nd}$ information bit corresponding to the $3^{rd}$ bit, so that the $13^{th}$ bit carries same user data as the $3^{rd}$ bit; the $8^{th}$ bit may be used as a $2^{nd}$ information bit corresponding to the $5^{th}$ bit, so that the $8^{th}$ bit carries same user data as the $5^{th}$ bit. It should be noted that, for ease of description, in the embodiments of the present invention, bits in the k+1 code words are numbered in a uniform manner.

The $(i+1)^{th}$ code word includes q $(i+1)^{th}$ information bits carrying user data, and each $(i+1)^{th}$ information bit carries same user data as one uniquely corresponding $i^{th}$ retransmission bit. The $(i+1)^{th}$ information bits include first q bits in bits of the $(i+1)^{th}$ code word that are sorted by channel capacity in descending order, the $i^{th}$ retransmission bits include first q bits in bits that carry user data in an $i^{th}$ combined code word and that are sorted by channel capacity in ascending order, the $i^{th}$ combined code word is generated by combining the $i^{th}$ code word to the $1^{st}$ code word, i=2, 3, ..., k, and q is a positive integer not greater than n.

Figure 3:
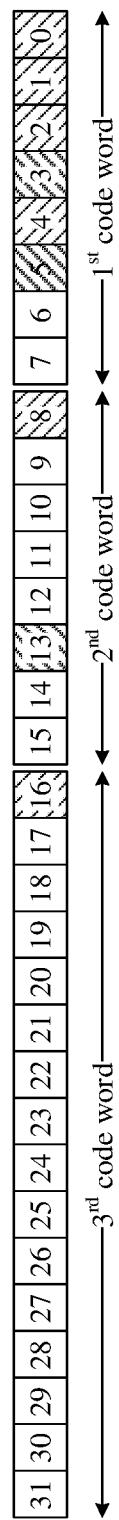
FIG. 3 is another schematic structural diagram of a code word according to this application.

For example, the $3^{rd}$ code word may include one $3^{rd}$ information bit, a $2^{nd}$ combined bit segment includes one $2^{nd}$ retransmission bit, and the $2^{nd}$ combined code word is constituted by combining the $2^{nd}$ code word and the $1^{st}$ code word. The $3^{rd}$ information bit may be a bit with largest channel capacity in the $3^{rd}$ code word, and the $2^{nd}$ retransmission bit may be a bit with smallest channel capacity in the $2^{nd}$ information bits and the $1^{st}$ information bits. As shown in FIG. 3, if the largest-channel-capacity bit in the $3^{rd}$ code word is a $17^{th}$ bit, and the smallest-channel-capacity bit in the $1^{st}$ information bits and the $2^{nd}$ information bits is a $3^{rd}$ bit, the $17^{th}$ bit is the $3^{rd}$ information bit, and the $3^{rd}$ bit is the $2^{nd}$ retransmission bit. In this case, a $17^{th}$ bit may carry same user data as the $3^{rd}$ bit.

To reduce a quantity of bits that need to be decoded by the receiving device, a bit other than an information bit used for carrying user data in each of the k+1 codes from the $1^{st}$ code word to a $(k+1)^{th}$ code word may be referred to as a frozen bit. The frozen bits may carry a same preset value. For example, values of all the frozen bits may be 1, or values of the frozen bits may be 0.

In the embodiments of the present invention, a combined code word is generated by combining at least one code word. A $1^{st}$ combined code word is the $1^{st}$ code word, and an $(i+1)^{th}$ combined code word is generated by combining the $(i+1)^{th}$ code word and the $i^{th}$ combined code word. For example, the is combined code word is the $1^{st}$ code word, the $2^{nd}$ combined code word is generated by combining the $2^{nd}$ code word and the $1^{st}$ code word, and a $3^{rd}$ combined code word is generated by combining the $3^{rd}$ code word and the $2^{nd}$ combined code word. It should be noted herein that the combination mentioned in this application is to connect the end of a code word to the beginning of another code word to form a new code word.

The following describes a data sending method and a data receiving method in the present invention with reference to a structure of the foregoing code word.

Figure 4:
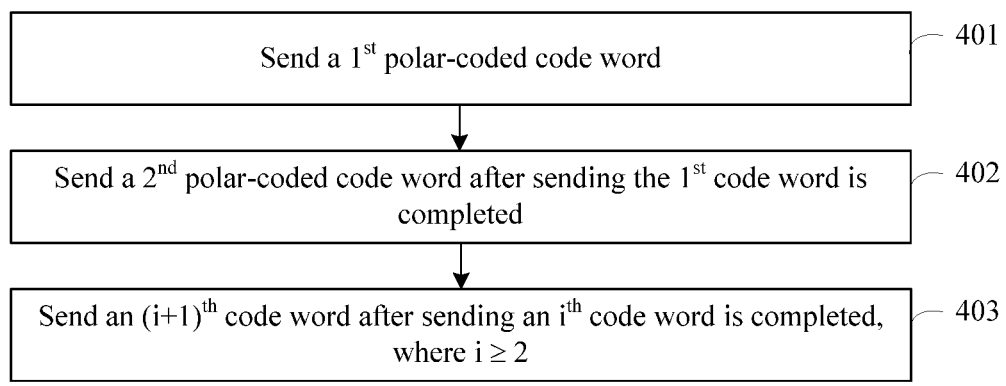
FIG. 4 is a schematic flowchart of an embodiment of a data sending method according to this application.

Referring to FIG. 4, FIG. 4 is a schematic flowchart of an embodiment of a data sending method according to this application. The data sending method is performed by a sending device.

Step 401. Send a $1^{st}$ polar-coded code word.

Before sending the $1^{st}$ code word, the sending device may generate only the $1^{st}$ code word in advance.

The sending device may first select n bits with largest channel capacity in the $1^{st}$ code word as $1^{st}$ information bits, and then write user data with a length of n bits into the n information bits.

To reduce a quantity of bits that need to be decoded by a receiving device, the sending device may further set data carried by each frozen bit to a preset value.

After determining content carried by each bit in the $1^{st}$ code word, the sending device may perform polarization coding on the $1^{st}$ code word and send the $1^{st}$ polar-coded code word to the receiving device.

Step 402. Send a $2^{nd}$ polar-coded code word after the $1^{st}$ code word is sent.

After the $1^{st}$ code word is sent, if a retransmission request is received from the receiving device or another preset retransmission condition is satisfied, the sending device may generate and send the $2^{nd}$ polar-coded code word.

When the $2^{nd}$ code word is generated, first p bits in the $1^{st}$ information bits sorted by channel capacity in ascending order may be first selected as $1^{st}$ target bits, and first p bits in bits of the $2^{nd}$ code word that are sorted by channel capacity in descending order are selected as $2^{nd}$ information bits. After determining a correspondence between the $1^{st}$ target bits and the $2^{nd}$ information bits, to make each $1^{st}$ target bit uniquely corresponding to one $2^{nd}$ information bit, the sending device may copy user data carried in the $1^{st}$ target bits to the corresponding $2^{nd}$ information bits, where p may be a preset value.

In addition to copying the user data carried in the $1^{st}$ target bits to the corresponding $2^{nd}$ information bits, the sending device may further set data carried by each frozen bit in the $2^{nd}$ code word to a preset value. After determining content carried by each bit in the $2^{nd}$ code word, the sending device may perform polarization coding on the $2^{nd}$ code word and send the $2^{nd}$ polar-coded code word to the receiving device.

Step 403. Send an $(i+1)^{th}$ code word after an $i^{th}$ code word is sent.

After the $i^{th}$ code word is sent, if a retransmission request is received from the receiving device again or another preset retransmission condition is satisfied, the sending device may generate and send the $(i+1)^{th}$ polar-coded code word.

When generating the $(i+1)^{th}$ code word, the sending device may first select, from $i^{th}$ information bits sorted by channel capacity in ascending order, first q bits as $i^{th}$ target bits, and select, from bits of the $(i+1)^{th}$ code word that are sorted by channel capacity in descending order, first q bits as $(i+1)^{th}$ information bits. After determining a correspondence between the $i^{th}$ target bits and the $(i+1)^{th}$ information bits, to make each $i^{th}$ target bit uniquely corresponding to one $(i+1)^{th}$ information bit, the sending device may copy user data carried in the $i^{th}$ target bits to the corresponding $(i+1)^{th}$ information bits, where q is a preset value. In addition, when a value of i is different, a value of q may also be different.

In addition to copying the user data carried in the $i^{th}$ target bits to the corresponding $(i+1)^{th}$ information bits, the sending device may further set data carried by each frozen bit in the $(i+1)^{th}$ code word to a preset value. After determining content carried by each bit in the $(i+1)^{th}$ code word, the sending device may perform polarization coding on the $(i+1)^{th}$ code word and send the $(i+1)^{th}$ polar-coded code word to the receiving device.

In another embodiment, to further reduce the quantity of bits that need to be decoded by the receiving device, the sending device may alternatively generate the $1^{st}$ code word to a $(k+1)^{th}$ code word in advance before sending the $1^{st}$ code word.

Specifically, after determining a value of k and a length of each of code words from the $1^{st}$ code word to the $(k+1)^{th}$ code word, the sending device may combine code words from the $(k+1)^{th}$ code word to the $1^{st}$ code word into a $(k+1)^{th}$ combined code word. For example, k=2, and when a length of the $1^{st}$ code word is 8 bits, a length of the $2^{nd}$ code word is 8 bits and a length of a $3^{rd}$ code word is 16 bits. A structure of a $3^{rd}$ combined code word may be shown in FIG. 5.

After the $(k+1)^{th}$ combined code word is determined, the sending device may perform channel estimation on the $(k+1)^{th}$ combined code word, so as to obtain polarization channel capacity distribution of the $(k+1)^{th}$ combined code word. Then, the sending device may write the user data into n bits with largest channel capacity in the $(k+1)^{th}$ combined code word; and successively copy, to target bits corresponding to to-be-copied bits, data carried by the to-be-copied bits in the $(k+1)^{th}$ code word to the $2^{nd}$ code word, where to-be-copied bits in a $j^{th}$ code word include bits carrying user data in the $j^{th}$ code word, the target bits include bits with largest channel capacity, excluding bits carrying user data, in a $(j-1)^{th}$ combined code word, and j=2, 3, . . . , k+i. In addition, the sending device may further set data carried by each frozen bit in the $(k+1)^{th}$ combined code word to a preset value, where the each frozen bit in the $(k+1)^{th}$ combined code word is a bit other than the $1^{st}$ to the $(i+1)^{th}$ information bits in the $(k+1)^{th}$ combined code word.

Figure 5:
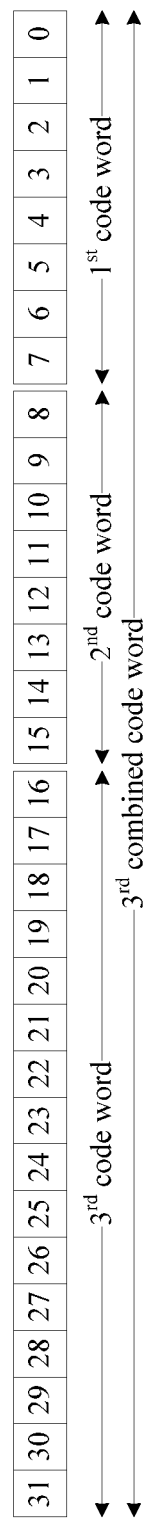
FIG. 5 is a schematic structural diagram of a $3^{rd}$ combined code word according to this application.
Figure 6:
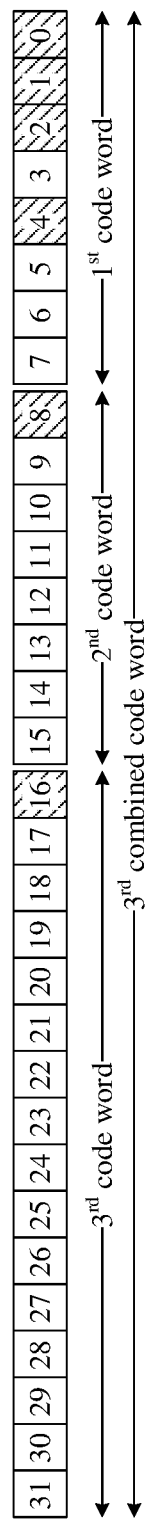
FIG. 6 is a schematic diagram of information bit distribution of a $3^{rd}$ combined code word according to this application.

For example, when the $3^{rd}$ combined code word is shown in FIG. 5, if a length of user data is six bits, and six bits with largest channel capacity determined through channel capacity estimation in the $3^{rd}$ combined code word are a $0^{th}$ bit, a $1^{st}$ bit, a $2^{nd}$ bit, a $4^{th}$ bit, an $8^{th}$ bit, and a $16^{th}$ bit, the user data may be first written into the six bits. A schematic diagram of distribution of information bits in the $1^{st}$ code word to the $3^{rd}$ code word may be shown in FIG. 6.

The $16^{th}$ bit is located in the $3^{rd}$ code word and carries user data. Therefore, the data carried by the $16^{th}$ bit needs to be copied to a target bit in a $2^{nd}$ combined code word. If it is determined through channel capacity estimation that a largest-channel-capacity bit excluding the $0^{th}$ bit, the $1^{st}$ bit, the $2^{nd}$ bit, the $4^{th}$ bit, and the $8^{th}$ bit in the $2^{nd}$ combined code word is a $13^{th}$ bit, the user data carried in the $16^{th}$ bit may be copied to the $13^{th}$ bit.

Figure 7:
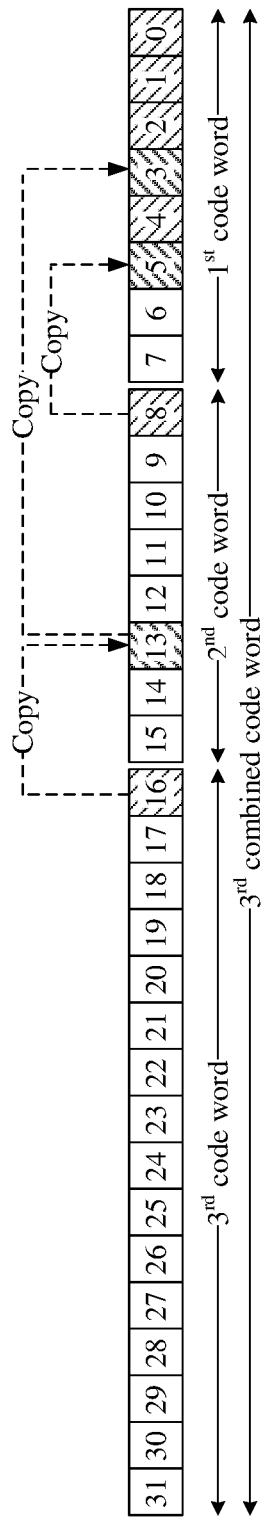
FIG. 7 is a schematic diagram of a correspondence of copying user data in a $3^{rd}$ combined code word according to this application.

Likewise, the $13^{th}$ bit and the $8^{th}$ bit carry user data. Therefore, the data carried by the $13^{th}$ bit and the $8^{th}$ bit needs to be copied to target bits in a $1^{st}$ combined code word. The $1^{st}$ combined code word is the $1^{st}$ code word. If it is determined through channel capacity estimation that bits with largest channel capacity excluding the $0^{th}$ bit, the $1^{st}$ bit, the $2^{nd}$ bit, and the $4^{th}$ bit in the $2^{nd}$ combined code word are a $3^{rd}$ bit and a $5^{th}$ bit, the user data carried by the $13^{th}$ bit may be copied to the $3^{rd}$ bit, and the user data carried by the $8^{th}$ bit may be correspondingly copied to the $5^{th}$ bit. A correspondence in a user data copy process may be shown in FIG. 7.

In addition, the sending device sets data carried by frozen bits such as a $6^{th}$ bit and a $7^{th}$ bit, a $9^{th}$ bit to a $12^{th}$ bit, a $14^{th}$ bit and a $15^{th}$ bit, and a $17^{th}$ bit to a $31^{th}$ bit to a preset value.

In this implementation, a value of p and a value of q do not need to be preset. In addition, p and q may have relatively small values. This simplifies a code word decoding process of the receiving device.

After the $(k+1)^{th}$ code word is sent, if the sending device re-receives a retransmission request for this part of user data, the sending device may re-perform step 401 to step 403; if the receiving device correctly receives the user data, the sending device may send other user data.

According to the method provided in this embodiment, it can be ensured that channel capacity of all bits used for carrying user data in a code word for initial transmission and a code word for retransmission are the largest in the code words when a HARQ technology is used for data retransmission. In this way, when the receiving device performs combination and decoding on a code word, both a coding gain and an energy gain can be increased, thereby improving decoding performance of the code word.

Figure 8:
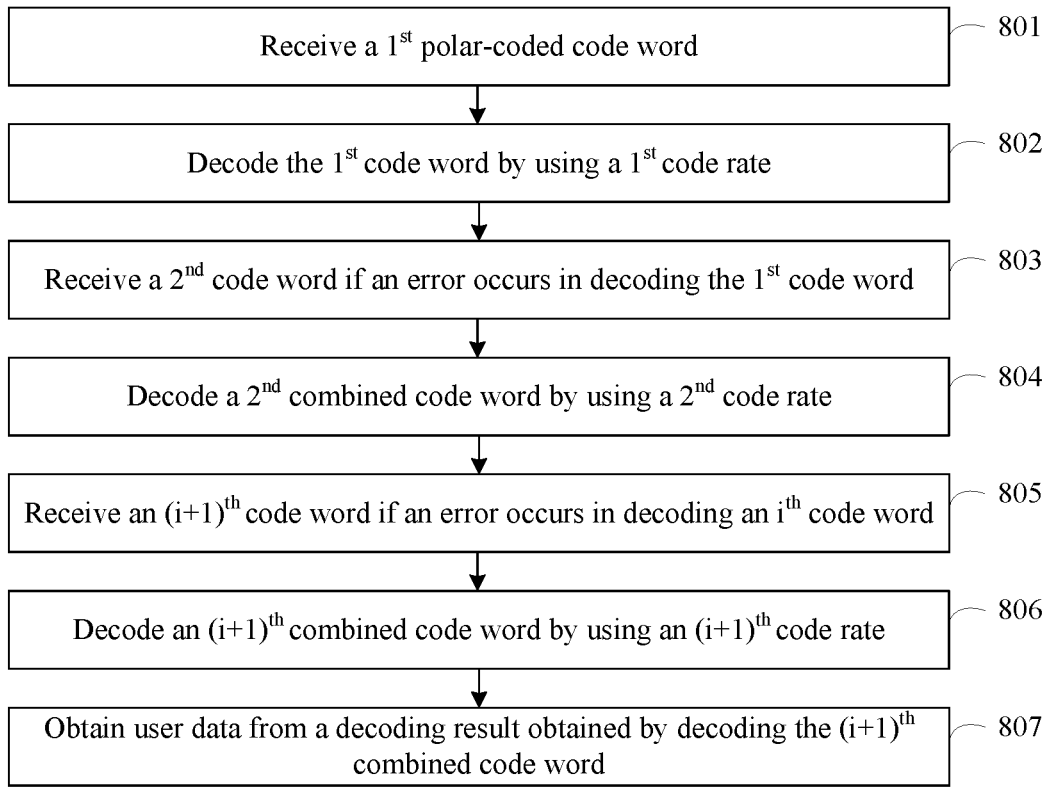
FIG. 8 is a schematic flowchart of an embodiment of a data receiving method according to this application.

Referring to FIG. 8, FIG. 8 is a schematic flowchart of an embodiment of a decoding method according to this application. In this embodiment, for lengths of a $1^{st}$ code word to a $(k+1)^{th}$ code word and content carried by each bit, refer to the foregoing descriptions. Details are not described herein again.

Step 801. Receive a $1^{st}$ polar-coded code word.

A receiving device may first receive the $1^{st}$ polar-coded code word.

Step 802. Decode the $1^{st}$ code word by using a $1^{st}$ code rate.

After receiving the $1^{st}$ code word, the receiving device may decode the $1^{st}$ code word by using the $1^{st}$ code rate.

The $1^{st}$ code word carries all content of user data. Therefore, if the $1^{st}$ code word is successfully decoded, bits for the user data may be obtained directly from a decoding result of the $1^{st}$ code word, and the user data is further restored based on a manner of arranging the bits of the user data in the $1^{st}$ code word.

When decoding the $1^{st}$ code word, the receiving device may decode each bit of the $1^{st}$ code word bit by bit in descending order. For example, when a structure of the $1^{st}$ code word is shown in FIG. 1, the receiving device may decode each bit of the $1^{st}$ code word bit by bit from a $7^{th}$ bit to a $0^{th}$ bit.

If the $1^{st}$ code word is successfully decoded, the receiving device may obtain the user data from the decoding result obtained by decoding the $1^{st}$ code word.

Step 803. Receive a $2^{nd}$ code word if an error occurs in decoding the $1^{st}$ code word.

When decoding the $1^{st}$ code word fails because the error occurs in decoding the $1^{st}$ code word, the receiving device may send a retransmission request to a sending device. After receiving the retransmission request, the sending device sends the $2^{nd}$ code word to the receiving device.

Step 804. Decode a $2^{nd}$ combined code word by using a $2^{nd}$ code rate.

The $2^{nd}$ combined code word is generated by combining the $2^{nd}$ code word and the $1^{st}$ code word. A length of the $2^{nd}$ combined code word is longer than that of the $1^{st}$ code word. Therefore, the $2^{nd}$ code rate needs to be greater than the $1^{st}$ code rate. Generally, a ratio of the $2^{nd}$ code rate to the $1^{st}$ code rate may be equal to a bit length ratio of the $2^{nd}$ combined code word to the $1^{st}$ code word.

Figure 9:
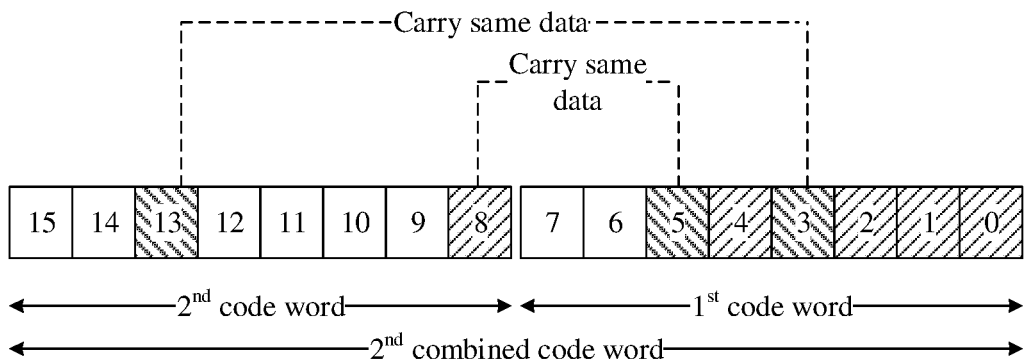
FIG. 9 is a schematic structural diagram of a $2^{nd}$ combined code word according to this application.

When decoding the $2^{nd}$ combined code word, the receiving device may decode each bit of the $2^{nd}$ combined code word bit by bit in descending order. For example, when a structure of the $2^{nd}$ combined code word is shown in FIG. 9, the receiving device may decode each bit of the $2^{nd}$ combined code word bit by bit from a $15^{th}$ bit to a $0^{th}$ bit. If the $2^{nd}$ combined code word is successfully decoded, the receiving device may obtain user data from a decoding result obtained by decoding the $2^{nd}$ combined code word.

A $3^{rd}$ bit carries same user data as a $13^{th}$ bit. Therefore, the receiving device may directly use a decoding result of the $13^{th}$ bit as a decoding result of the $3^{rd}$ bit, or determine a decoding result of the $3^{rd}$ bit based on a decoding process of the $13^{th}$ bit. Similarly, the receiving device may also determine a decoding result of a $5^{th}$ bit based on a decoding process or a decoding result of an $8^{th}$ bit.

Step 805. Receive an $(i+1)^{th}$ code word if an error occurs in decoding an $i^{th}$ code word.

When an error occurs in decoding an $i^{th}$ combined code word, the receiving device may send a retransmission request to the sending device. After receiving the retransmission request, the sending device sends the $(i+1)$ code word to the receiving device.

Step 806. Decode an $(i+1)^{th}$ combined code word by using an $(i+1)^{th}$ code rate.

The $(i+1)^{th}$ combined code word is generated by combining the $(i+1)^{th}$ code word and the $i^{th}$ combined code word. A length of the $(i+1)^{th}$ combined code word is longer than that of the $i^{th}$ code word. Therefore, the $(i+1)^{th}$ code rate needs to be greater than an $i^{th}$ code rate. Generally, a ratio of the $(i+1)^{th}$ code rate to the $i^{th}$ code rate may be equal to a bit length ratio of the $(i+1)^{th}$ combined code word to the $i^{th}$ code word.

When decoding the $(i+1)^{th}$ combined code word, the receiving device may decode each bit of the $(i+1)^{th}$ combined code word bit by bit in descending order. For example, $i=2$. A structure of a $3^{rd}$ combined code word may be shown in FIG. 10, and the receiving device may decode each bit of the $3^{rd}$ combined code word bit by bit from a $3^{th}$ bit to a $0^{th}$ bit.

When decoding is performed on the $(i+1)^{th}$ combined bit segment, if a to-be-decoded bit is a $1^{st}$ to-be-decoded bit, a decoding result of the $1^{st}$ to-be-decoded bit is determined based on a decoding result of a $2^{nd}$ to-be-decoded bit, where the $1^{st}$ to-be-decoded bit is one of $i^{th}$ information bits, the $2^{nd}$ to-be-decoded bit is one of $(i+1)^{th}$ information bits to $(k+1)^{th}$ information bits, and the $1^{st}$ to-be-decoded bit carries same data as the $2^{nd}$ to-be-decoded bit.

If a decoding manner used for decoding the $(i+1)^{th}$ combined code word is successive cancellation decoding, the receiving device has decoded the $2^{nd}$ to-be-decoded bit when decoding the $1^{st}$ to-be-decoded bit. The $2^{nd}$ to-be-decoded bit carries the same user data as the $1^{st}$ to-be-decoded bit. Therefore, the decoding result of the $2^{nd}$ to-be-decoded bit may be directly used as the decoding result of the $1^{st}$ to-be-decoded bit.

Figure 10:
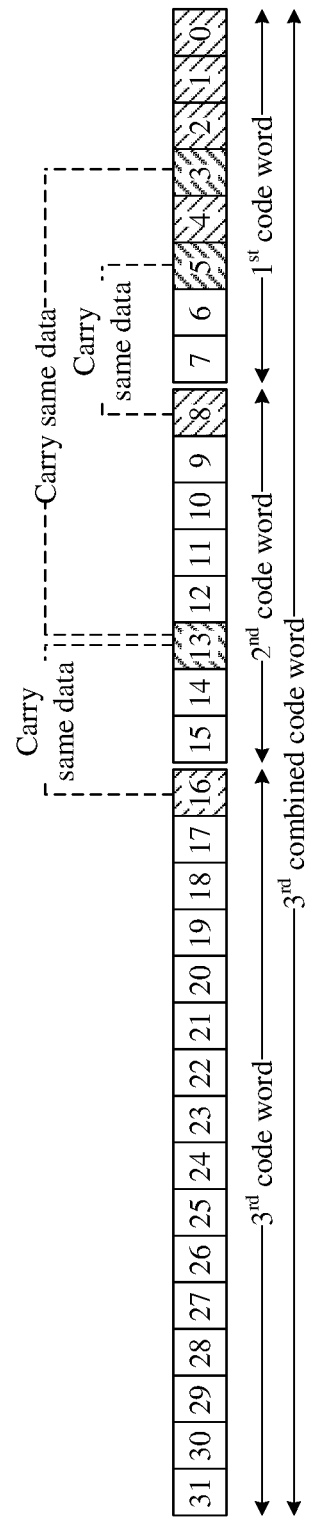
FIG. 10 is a schematic structural diagram of a $3^{rd}$ combined code word according to this application.

For example, when the structure of the $3^{rd}$ combined code word is shown in FIG. 10, because a $16^{th}$ bit, a $13^{th}$ bit, and a $3^{rd}$ bit carry same user data, a decoding result of the $16^{th}$ bit may be used as a decoding result of the $13^{th}$ bit, and the decoding results of the $13^{th}$ bit and the $16^{th}$ bit may be used as a decoding result of the $3^{rd}$ bit.

If a decoding manner used for decoding the $(i+1)^{th}$ combined code word is list decoding, when decoding the $1^{st}$ to-be-decoded bit, the receiving device has decoded the $2^{nd}$ to-be-decoded bit and generates a survivor path, but has not determined the decoding result of the $2^{nd}$ to-be-decoded bit based on a branch metric of a decision branch of the survivor path. The $2^{nd}$ to-be-decoded bit carries the same user data as the $1^{st}$ to-be-decoded bit. Therefore, the receiving device may select same decision branches of the survivor path generated in a process of decoding the $2^{nd}$ to-be-decoded bit, and calculate a branch metric of each same decision branch, so as to determine the decoding results of the $2^{nd}$ to-be-decoded bit and the $1^{st}$ to-be-decoded bit at the same time.

For example, when the structure of the $3^{rd}$ combined code word is shown in FIG. 10, because a $16^{th}$ bit, a $13^{th}$ bit, and a $3^{rd}$ bit carry same user data, the branch metric of each same decision branch is calculated, so as to determine decoding results of the $16^{th}$ bit, the $13^{th}$ bit, and the $3^{rd}$ bit at the same time.

Step 807. Obtain user data from a decoding result obtained by decoding the $(i+1)^{th}$ combined code word.

If the $(i+1)^{th}$ combined code word is successfully decoded, the receiving device may obtain the user data from the decoding result obtained by decoding the $(i+1)^{th}$ combined code word.

According to the method provided in this embodiment, it can be ensured that channel capacity of all bits used for carrying user data in a code word for initial transmission and a code word for retransmission are the largest in the code words when a HARQ technology is used for data retransmission. In this way, when the receiving device performs combination and decoding on a code word, both a coding gain and an energy gain can be increased, thereby improving decoding performance of the code word.

Figure 11:
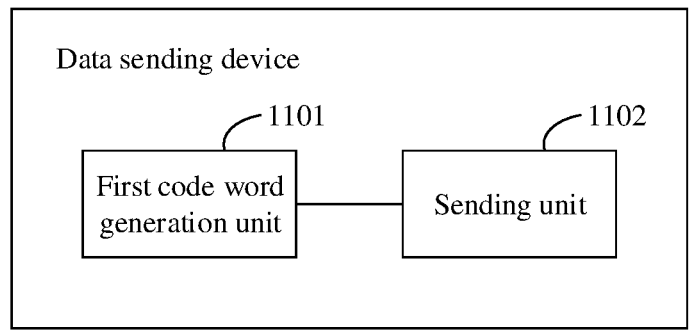
FIG. 11 is a schematic structural diagram of an embodiment of a data sending device according to this application.

Referring to FIG. 11, FIG. 11 is a schematic structural diagram of an embodiment of a data sending device according to this application.

As shown in FIG. 11, the sending device may include a first code word generation unit 1101 and a sending unit 1102.

The first code word generation unit 1101 is configured to generate a $1^{st}$ code word and a $2^{nd}$ code word, where the $1^{st}$ code word includes n $1^{st}$ information bits carrying user data, the $1^{st}$ information bits include first n bits in bits of the $1^{st}$ code word that are sorted by channel capacity in descending order, the $2^{nd}$ code word includes p $2^{nd}$ information bits carrying user data, each $2^{nd}$ information bit carries same user data as one uniquely corresponding $1^{st}$ retransmission bit, the $2^{nd}$ information bits include first p bits in bits of the $2^{nd}$ code word that are sorted by channel capacity in descending order, the $1^{st}$ retransmission bits include first p bits in the $1^{st}$ information bits sorted by channel capacity in ascending order, n is a positive integer, p is a positive integer not greater than n, and both the $1^{st}$ code word and the $2^{nd}$ code word are polar-coded code words. The sending unit 1102 is configured to send the $1^{st}$ code word, and send the $2^{nd}$ code word after sending the $1^{st}$ code word is completed.

Optionally, the sending unit 1102 is further configured to send an $(i+1)^{th}$ code word after an $i^{th}$ code word is sent, where the $(i+1)^{th}$ code word includes q $(i+1)^{th}$ information bits carrying user data, and each $(i+1)^{th}$ information bit carries same user data as one uniquely corresponding $i^{th}$ retransmission bit; and the $(i+1)^{th}$ information bits include first q bits in bits of the $(i+1)^{th}$ code word that are sorted by channel capacity in descending order, the $i^{th}$ retransmission bits include first q bits in bits that carry user data in an $i^{th}$ combined code word and that are sorted by channel capacity in ascending order, the $i^{th}$ combined code word is generated by combining the $i^{th}$ code word and an $(i-1)^{th}$ combined code word, $i=2, 3, \ldots, k$, a $1^{st}$ combined code word is the $1^{st}$ code word, k is a maximum quantity of retransmissions, q is a positive integer not greater than n, and both the $i^{th}$ code word and the $(i+1)^{th}$ code word are polar-coded code words.

Optionally, a length of the $1^{st}$ code word is equal to that of the $2^{nd}$ code word, and a length of the $(i+1)^{th}$ code word is twice that of the $i^{th}$ code word. Each frozen bit in the code words from the $1^{st}$ code word to the $(i+1)^{th}$ code word carries a preset value, and the frozen bit is a bit other than information bits in the $1^{st}$ code word to the $(i+1)^{th}$ code word.

Optionally, in addition to the first code word generation unit 1101 configured to generate the $1^{st}$ code word and the $2^{nd}$ code word, the apparatus further includes a second code word generation unit. The second code word generation unit is configured to generate the $(i+1)^{th}$ code word.

The second code word generation unit includes: a first channel estimation subunit, configured to perform channel estimation on an $(i+1)^{th}$ combined code word to obtain polarization channel capacity distribution of the $(i+1)^{th}$ combined code word, where the $(i+1)^{th}$ combined code word is generated by combining code words from the $(i+1)^{th}$ code word to the $1^{st}$ code word in descending order; a target bit selection subunit, configured to select, from bits sorted by channel capacity in ascending order in the $1^{st}$ information bits to $i^{th}$ information bits, first q bits as $i^{th}$ target bits; an information bit selection subunit, configured to select, from bits of the $(i+1)^{th}$ code word that are sorted by channel capacity in descending order, first q bits as the $(i+1)^{th}$ information bits; a first copy subunit, configured to copy user data carried by each $i^{th}$ target bit to a corresponding $(i+1)^{th}$ information bit; and a first setting subunit, configured to set data carried by each frozen bit in the $(i+1)^{th}$ code word to a preset value, where the each frozen bit in the $(i+1)^{th}$ code word is a bit other than the $(i+1)^{th}$ information bits in the $(i+1)^{th}$ code word.

Optionally, code words from the $1^{st}$ code word to a $(k+1)^{th}$ code word may be all generated by the first code word generation unit 1101.

When the code words from the $1^{st}$ code word to the $(k+1)^{th}$ code word are all generated by the first code word generation unit 1101, the first code word generation unit 1101 may include: a second channel estimation subunit, configured to perform channel estimation on a $(k+1)^{th}$ combined code word to obtain polarization channel capacity distribution of the $(k+1)^{th}$ combined code word, where the $(k+1)^{th}$ combined code word is generated by combining code words from the $(k+1)^{th}$ code word to the $1^{st}$ code word in descending order; a write subunit, configured to write the user data into n bits with largest channel capacity in the $(k+1)^{th}$ combined code word; a second copy subunit, configured to successively copy, to target bits corresponding to to-be-copied bits, data carried by the to-be-copied bits in the $(k+1)^{th}$ code word to the $2^{nd}$ code word, where to-be-copied bits in a $j^{th}$ code word include bits carrying user data in the $j^{th}$ code word, the target bits include bits with largest channel capacity, excluding bits carrying user data, in a $(j-1)^{th}$ combined code word, and $j=2, 3, \ldots, k+1$; and a second setting subunit, configured to set data carried by each frozen bit in the $(k+1)^{th}$ combined code word to a preset value, where the each frozen bit in the $(k+1)^{th}$ combined code word is a bit other than the bits carrying the user data in the $(k+1)^{th}$ combined code word.

Figure 12:
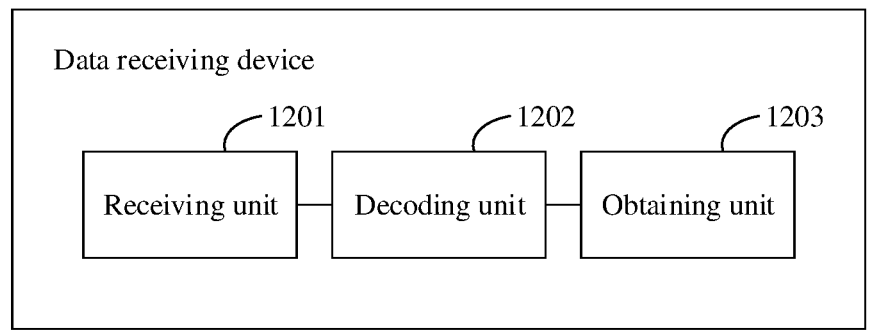
FIG. 12 is a schematic structural diagram of an embodiment of a data receiving device according to this application.

Referring to FIG. 12, FIG. 12 is a schematic structural diagram of an embodiment of a data receiving device according to this application.

As shown in FIG. 12, the receiving device may include a receiving unit 1201, a decoding unit 1202, and an obtaining unit 1203.

The receiving unit 1201 is configured to receive a $1^{st}$ polar-coded code word, where the $1^{st}$ code word includes $1^{st}$ information bits carrying user data, and the $1^{st}$ information bits include first n bits in bits of the code word that are sorted by channel capacity in descending order.

The decoding unit 1202 is configured to decode the $1^{st}$ code word by using a $1^{st}$ code rate. The receiving unit 1201 is further configured to receive a $2^{nd}$ code word if an error occurs in decoding the $1^{st}$ code word, where the $2^{nd}$ code word includes p $2^{nd}$ information bits carrying user data, each $2^{nd}$ information bit carries same user data as one corresponding $1^{st}$ retransmission bit, the $2^{nd}$ information bits include first p bits in bits of the code word that are sorted by channel capacity in descending order, the $1^{st}$ retransmission bits include first p bits in the $1^{st}$ information bits sorted by channel capacity in ascending order, n is a positive integer, and p is a positive integer not greater than n. The decoding unit 1202 is further configured to decode a $2^{nd}$ combined code word by using a $2^{nd}$ code rate, where the $2^{nd}$ combined code word is generated by combining the $2^{nd}$ code word and the $1^{st}$ code word, and the $2^{nd}$ code rate is greater than the $1^{st}$ code rate. The obtaining unit 1203 is configured to obtain user data from a decoding result obtained by decoding the $2^{nd}$ combined code word.

Optionally, the receiving unit 1201 is further configured to receive an $(i+1)^{th}$ code word if an error occurs in decoding an $i^{th}$ code word, where the $(i+1)^{th}$ code word includes q $(i+1)^{th}$ information bits carrying user data, each $(i+1)^{th}$ information bit carries same user data as one corresponding $i^{th}$ retransmission bit, the $(i+1)^{th}$ information bits include first q bits in bits of the code word that are sorted by channel capacity in descending order, the $i^{th}$ retransmission bits include first q bits in bits that carry user data in an $i^{th}$ combined code word and that are sorted by channel capacity in ascending order, the $i^{th}$ combined code word is generated by combining the $i^{th}$ code word to the $1^{st}$ code word, i=2, 3, . . . , k, k is a maximum quantity of retransmissions, and q is a positive integer not greater than n. The decoding unit 1202 is further configured to decode an $(i+1)^{th}$ combined code word by using an $(i+1)^{th}$ code rate, where the $(i+1)^{th}$ combined code word is generated by combining code words from the $(i+1)^{th}$ code word to the $1^{st}$ code word. The obtaining unit 1203 is further configured to obtain user data from a decoding result obtained by decoding the $(i+1)^{th}$ combined code word.

Optionally, the decoding unit 1202 is specifically configured to: when a to-be-decoded bit is a $1^{st}$ to-be-decoded bit, determine a decoding result of the $1^{st}$ to-be-decoded bit based on a decoding result of a $2^{nd}$ to-be-decoded bit, where the $1^{st}$ to-be-decoded bit is one of $i^{th}$ information bits, the $2^{nd}$ to-be-decoded bit is one of information bits from the $(i+1)^{th}$ information bits to $(k+1)^{th}$ information bits, and the $1^{st}$ to-be-decoded bit carries same data as the $2^{nd}$ to-be-decoded bit. Specifically, the decoding unit 1202 may be configured to: when a decoding manner used for decoding the $(i+1)^{th}$ combined code word is successive cancellation decoding, use the decoding result of the $2^{nd}$ to-be-decoded bit as the decoding result of the $1^{st}$ to-be-decoded bit; or configured to: when a decoding manner used for decoding the $(i+1)^{th}$ combined code word is list decoding, select same decision branches of a survivor path generated in a process of decoding the $2^{nd}$ to-be-decoded bit, and calculate a branch metric of each same decision branch, so as to determine the decoding result of the $1^{st}$ to-be-decoded bit.

Figure 13:
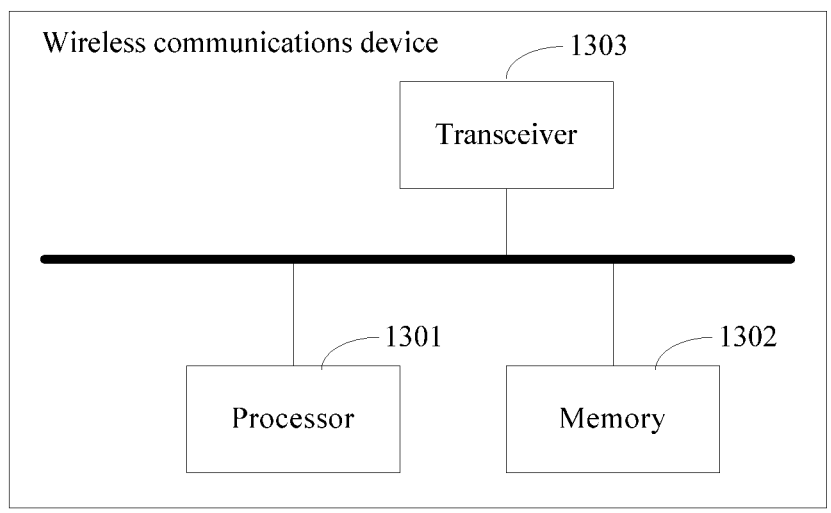
FIG. 13 is a schematic structural diagram of an embodiment of a wireless communications device according to this application.

Referring to FIG. 13, FIG. 13 is a schematic structural diagram of an embodiment of a wireless communications device according to this application. The wireless communications device may be the sending device or the receiving device in the foregoing embodiments.

As shown in FIG. 13, the wireless communications device may include a processor 1301, a memory 1302, a transceiver 1303, and the like. In addition, the wireless communications device may further include components such as an output module, an input module, and a sensor. These components may be connected to and communicate with each other in a bus structure, a star structure, or the like by using one or more buses.

The processor 1301 is a control center of the wireless communications device, is connected to each part of the entire wireless communications device by using various interfaces and lines, and executes various functions of the wireless communications device and/or processes data by running or executing a software program and/or module stored in the memory 1302 and invoking data stored in the memory 1302. The processor 1301 may include an integrated circuit (IC for short), for example, may include a single encapsulated IC, or may include a plurality of connected encapsulated ICs that have same or different functions. For example, the processor 1301 may include only a central processing unit (CPU for short), or may be a combination of a GPU, a digital signal processor (DSP for short), and a control chip (such as a base band chip) of the transceiver 1303. In an implementation of the present invention, the CPU may be a single computing core, or may include a plurality of computing cores.

The transceiver 1303 is configured to establish a communications channel, so that the wireless communications device is connected to a receiving device by using the communications channel, thereby implementing data transmission between the wireless communications devices. The transceiver 1303 may include communications modules such as a wireless local area network (wireless LAN) module, a Bluetooth module, and a baseband module, and radio frequency (RF) circuits corresponding to the communications modules. The transceiver 1303 is configured to perform wireless local area network communication, Bluetooth communication, infrared communication, and/or cellular communications system communication, for example, Wideband Code Division Multiple Access (WCDMA) and/or High Speed Downlink Packet Access (HSDPA). The transceiver 1303 is configured to control communication between the components of the wireless communications device, and can support direct memory access (direct memory access).

In different implementations of the present invention, the communications modules in the transceiver 1303 are generally presented in a form of integrated circuit chip (integrated circuit chip), and may be selectively combined, without requiring that all the communications modules and corresponding antenna groups be included. For example, the transceiver 1303 may include only a baseband chip, a radio frequency chip, and a corresponding antenna, to provide a communication function in a cellular communications system. Through a wireless communication connection, for example, wireless local area network access or WCDMA access, established by the transceiver 1303, the wireless communications device may be connected to a cellular network (cellular network) or the Internet (Internet). In some optional implementations of the present invention, the communications modules, for example, the baseband module, in the transceiver 1303 may be integrated into the processor 1301. A typical example is an APQ+MDM series platform provided by Qualcomm (Qualcomm). The radio frequency circuit is configured to receive and send a signal in an information transmission and reception process or a call process. For example, the radio frequency circuit receives downlink information of a base station and provides the downlink information to the processor 1301 for processing, and sends uplink-related data to the base station. Generally, the radio frequency circuits include known circuits configured to execute these functions, including but not limited to an antenna system, a radio frequency transceiver, one or more amplifiers, a tuner, one or more oscillators, a digital signal processor, a codec chipset, a subscriber identity module (SIM) card, the memory 1302, and the like. In addition, the radio frequency circuit may further communicate with a network and another device through wireless communication. The wireless communication may use any communications standard or protocol, including but not limited to a Global System for Mobile Communications (GSM), a general packet radio service (GPRS), Code Division Multiple Access (CDMA), Wideband Code Division Multiple Access (WCDMA), a High Speed Uplink Packet Access (HSUPA) technology, Long Term Evolution (LTE), an email service, a short messaging service (SMS), and the like.

In this embodiment of this application, when the wireless communications device is used as a sending device, the processor 1301 may be configured to generate code words from a $1^{st}$ code word to a $(k+1)^{th}$ code word; and the transceiver 1303 may be configured to send the $1^{st}$ code word to the $(k+1)^{th}$ code word. For specific manners of generating and sending the $1^{st}$ code word to the $(k+1)^{th}$ code word, refer to the foregoing embodiments. Details are not described herein again.

When the wireless communications device is used as a receiving device, the transceiver 1303 may be configured to receive a $1^{st}$ code word to a $(k+1)^{th}$ code word; and the processor 1301 may be configured to decode a $1^{st}$ combined code word to a $(k+1)^{th}$ combined code word. For a manner of receiving the $1^{st}$ code word to the $(k+1)$ code word and a specific manner of decoding the $1^{st}$ combined code word to the $(k+1)^{th}$ combined code word, refer to the foregoing embodiments. Details are not described herein again.

In specific implementation, the present invention further provides a computer storage medium, where the computer storage medium may store a program. When the program is executed, a part or all of the steps of the embodiments of the data sending method and data receiving method provided in the present invention may be performed. The storage medium may include: a magnetic disk, an optical disc, a read-only memory (ROM), or a random access memory (RAM).

A person skilled in the art may clearly understand that the technologies in the embodiments of the present invention may be implemented by software in addition to a necessary general hardware platform. Based on such an understanding, the technical solutions of the present invention essentially or the part contributing to the prior art may be implemented in a form of a software product. The computer software product may be stored in a storage medium, such as a ROM/RAM, a hard disk, or an optical disc, and includes several instructions for instructing a computer device (which may be a personal computer, a server, a network device, or the like) to perform the methods described in the embodiments or some parts of the embodiments of the present invention.

The embodiments in this specification are described in a progressive manner. The same or similar parts in the embodiments can be understood by reference to each other. Especially, apparatus, device and system embodiments are basically similar to a method embodiment, and therefore are described briefly; for related parts, reference may be made to partial descriptions in the method embodiment.

The foregoing descriptions are implementations of the present invention, but are not intended to limit the protection scope of the present invention.

What is claimed is:

1. A data sending method comprising:
   transmitting, from a transceiver of a first device based on a wireless communication connection between the first device and a second device, a $1^{st}$ code word, wherein the $1^{st}$ code word comprises n $1^{st}$ information bits carrying user data, and the $1^{st}$ information bits comprise first n bits in bits of the $1^{st}$ code word that are sorted by channel capacity in descending order; and
   transmitting, from the transceiver, a $2^{nd}$ code word after the $1^{st}$ code word is sent in response to determining that the user data has to be retransmitted, wherein the $2^{nd}$ code word comprises p $2^{nd}$ information bits carrying user data, each $2^{nd}$ information bit carries same user data as one uniquely corresponding $1^{st}$ retransmission bit, the $2^{nd}$ information bits comprise first p bits in bits of the $2^{nd}$ code word that are sorted by channel capacity in descending order, the $1^{st}$ retransmission bits comprise first p bits in the $1^{st}$ information bits sorted by channel capacity in ascending order, wherein n is a positive integer, and p is a positive integer not greater than n, wherein the $1^{st}$ code word and the $2^{nd}$ code word are polar-coded code words, and wherein the $1^{st}$ code word and the $2^{nd}$ code word are used for obtaining the user data.

2. The method according to claim 1, further comprising:
   sending an $(i+1)^{th}$ code word after an $i^{th}$ code word is sent, wherein the $(i+1)^{th}$ code word comprises q $(i+1)^{th}$ information bits carrying user data, and each $(i+1)^{th}$ information bit carries same user data as one uniquely corresponding $i^{th}$ retransmission bit; and
   the $(i+1)^{th}$ information bits comprise first q bits in bits of the $(i+1)^{th}$ code word that are sorted by channel capacity in descending order, the $i^{th}$ retransmission bits comprise first q bits in bits that carry user data in an $i^{th}$ combined code word and that are sorted by channel capacity in ascending order, the $i^{th}$ combined code word is generated by combining the $i^{th}$ code word and an $(i-1)^{th}$ combined code word, wherein i=2, 3, . . . , k, a $1^{st}$ combined code word is the $1^{st}$ code word, k is a maximum quantity of retransmissions, q is a positive integer not greater than n, and both the $i^{th}$ code word and the $(i+1)^{th}$ code word are polar-coded code words.

3. The method according to claim 2, wherein a length of the $1^{st}$ code word is equal to that of the $2^{nd}$ code word, and a length of the $(i+1)^{th}$ code word is twice that of the $i^{th}$ code word.

4. The method according to claim 2, wherein each frozen bit in the $1^{st}$ code word to the $(i+1)^{th}$ code word carries a preset value, and the frozen bit is a bit other than information bits in the $1^{st}$ code word to the $(i+1)^{th}$ code word.

5. The method according to claim 2, wherein before the sending an $(i+1)^{th}$ code word, the method further comprises:
   performing channel estimation on an $(i+1)^{th}$ combined code word to obtain polarization channel capacity distribution of the $(i+1)^{th}$ combined code word, wherein the $(i+1)^{th}$ combined code word is generated by combining code words from the $(i+1)^{th}$ code word to the $1^{st}$ code word in descending order;
   selecting, from bits sorted by channel capacity in ascending order in the $1^{st}$ information bits to $i^{th}$ information bits, first q bits as $i^{th}$ target bits;
   selecting, from bits of the $(i+1)^{th}$ code word that are sorted by channel capacity in descending order, first q bits as the $(i+1)^{th}$ information bits;
   copying user data carried in each $i^{th}$ target bit to a corresponding $(i+1)^{th}$ information bit; and
   setting data carried by each frozen bit in the $(i+1)^{th}$ code word to a preset value, wherein a frozen bit in the $(i+1)^{th}$ code word is a bit other than the $(i+1)^{th}$ information bits in the $(i+1)^{th}$ code word.

6. The method according to claim 1, wherein before the sending a $1^{st}$ code word, the method further comprises:

performing channel estimation on a $(k+1)^{th}$ combined code word to obtain polarization channel capacity distribution of the $(k+1)^{th}$ combined code word, wherein the $(k+1)^{th}$ combined code word is generated by combining code words from a $(k+1)^{th}$ code word to the $1^{st}$ code word in descending order;

writing the user data into n bits with largest channel capacity in the $(k+1)^{th}$ combined code word;

successively copying, to target bits corresponding to to-be-copied bits, data carried by the to-be-copied bits in the $(k+1)^{th}$ code word to the $2^{nd}$ code word, wherein to-be-copied bits in a $j^{th}$ code word comprise bits carrying user data in the $j^{th}$ code word, the target bits comprise bits with largest channel capacity, excluding bits carrying user data, in a $(j+1)^{th}$ combined code word, and j=2, 3, . . . , k+1; and setting data carried by each frozen bit in the $(k+1)^{th}$ combined code word to a preset value, wherein a frozen bit in the $(k+1)^{th}$ combined code word is a bit other than the bits carrying the user data in the $(k+1)^{th}$ combined code word.

7. A data receiving method comprising:

receiving, by a receiver, a $1^{st}$ code word, wherein the $1^{st}$ code word comprises $1^{st}$ information bits carrying user data, and the $1^{st}$ information bits comprise first n bits in bits of the code word that are sorted by channel capacity in descending order;

decoding the $1^{st}$ code word;

receiving, by the receiver, a $2^{nd}$ code word if an error occurs in decoding the $1^{st}$ code word, wherein the $2^{nd}$ code word comprises p $2^{nd}$ information bits carrying user data, each $2^{nd}$ information bit carries same user data as one corresponding $1^{st}$ retransmission bit, the $2^{nd}$ information bits comprise first p bits in bits of the code word that are sorted by channel capacity in descending order, the $1^{st}$ retransmission bits comprise first p bits in the $1^{st}$ information bits sorted by channel capacity in ascending order, wherein n is a positive integer, and p is a positive integer not greater than n, wherein the $1^{st}$ code word and the $2^{nd}$ code word are polar-coded code words;

decoding a $2^{nd}$ combined code word, wherein the $2^{nd}$ combined code word is generated by combining the $2^{nd}$ code word and the $1^{st}$ code word; and obtaining user data from a decoding result obtained by decoding the $2^{nd}$ combined code word.

8. The method according to claim 7, further comprising:

receiving an $(i+1)^{th}$ code word if an error occurs in decoding an $i^{th}$ code word, wherein the $(i+1)^{th}$ code word comprises q $(i+1)^{th}$ information bits carrying user data, each $(i+1)^{th}$ information bit carries same user data as one corresponding $i^{th}$ retransmission bit, the $(i+1)^{th}$ information bits comprise first q bits in bits of the code word that are sorted by channel capacity in descending order, the $i^{th}$ retransmission bits comprise first q bits in bits that carry user data in an $i^{th}$ combined code word and that are sorted by channel capacity in ascending order, the $i^{th}$ combined code word is generated by combining code words from the $i^{th}$ code word to the $1^{st}$ code word, wherein i=2, 3, . . . , k, k is a maximum quantity of retransmissions, and q is a positive integer not greater than n;

decoding an $(i+1)^{th}$ combined code word, wherein the $(i+1)^{th}$ combined code word is generated by combining code words from the $(i+1)^{th}$ code word to the $1^{st}$ code word; and obtaining user data from a decoding result obtained by decoding the $(i+1)^{th}$ combined code word, wherein both the $i^{th}$ code word and the $(i+1)^{th}$ code word are polar-coded code words.

9. The method according to claim 8, wherein a length of the $1^{st}$ code word is equal to that of the $2^{nd}$ code word, and a length of the $(i+1)^{th}$ code word is twice that of the $i^{th}$ code word.

10. The method according to claim 8, wherein the decoding an $(i+1)^{th}$ combined code word comprises:

if a to-be-decoded bit is a $1^{st}$ to-be-decoded bit, determining a decoding result of the $1^{st}$ to-be-decoded bit based on a decoding result of a $2^{nd}$ to-be-decoded bit, wherein the $1^{st}$ to-be-decoded bit is one of $i^{th}$ information bits, the $2^{nd}$ to-be-decoded bit is one of information bits from the $(i+1)^{th}$ information bits to $(k+1)^{th}$ information bits, and the $1^{st}$ to-be-decoded bit carries same data as the $2^{nd}$ to-be-decoded bit.

11. The method according to claim 10, wherein the determining a decoding result of the $1^{st}$ to-be-decoded bit based on a decoding result of a $2^{nd}$ to-be-decoded bit comprises:

when a decoding manner used for decoding the $(i+1)^{th}$ combined code word is successive cancellation decoding, using the decoding result of the $2^{nd}$ to-be-decoded bit as the decoding result of the $1^{st}$ to-be-decoded bit.

12. The method according to claim 10, wherein the determining a decoding result of the $1^{st}$ to-be-decoded bit based on a decoding result of a $2^{nd}$ to-be-decoded bit comprises:

when a decoding manner used for decoding the $(i+1)^{th}$ combined code word is list decoding, selecting same decision branches of a survivor path generated in a process of decoding the $2^{nd}$ to-be-decoded bit, and calculating a branch metric of each same decision branch, to determine the decoding result of the $1^{st}$ to-be-decoded bit.

13. A device comprising:

a processor; and a non-transitory computer-readable storage medium coupled to the processor and storing programming instructions for execution by the processor, the programming instructions instruct the processor to:

generate a $1^{st}$ code word and a $2^{nd}$ code word, wherein the $1^{st}$ code word comprises n $1^{st}$ information bits carrying user data, the $1^{st}$ information bits comprise first n bits in bits of the $1^{st}$ code word that are sorted by channel capacity in descending order, the $2^{nd}$ code word comprises p $2^{nd}$ information bits carrying user data, each $2^{nd}$ information bit carries same user data as one uniquely corresponding $1^{st}$ retransmission bit, the $2^{nd}$ information bits comprise first p bits in bits of the $2^{nd}$ code word that are sorted by channel capacity in descending order, the $1^{st}$ retransmission bits comprise first p bits in the $1^{st}$ information bits sorted by channel capacity in ascending order, wherein n is a positive integer, p is a positive integer not greater than n, and both the $1^{st}$ code word and the $2^{nd}$ code word are polar-coded code words; and a transceiver to transmit the $1^{st}$ code word, and transmit the $2^{nd}$ code word after the $1^{st}$ code word is transmitted in response to determining that the user data has to be retransmitted, wherein the transmitted $1^{st}$ code word and the $2^{nd}$ code word are used for obtaining the user data.

14. The device according to claim 13, wherein the programming instructions instruct the processor to:

send an $(i+1)^{th}$ code word after an $i^{th}$ code word is sent, wherein the $(i+1)^{th}$ code word comprises q $(i+1)^{th}$ information bits carrying user data, and each $(i+1)^{th}$ information bit carries same user data as one uniquely corresponding $i^{th}$ retransmission bit; and the $(i+1)^{th}$ information bits comprise first q bits in bits of the $(i+1)^{th}$ code word that are sorted by channel capacity in descending order, the $i^{th}$ retransmission bits comprise first q bits in bits that carry user data in an $i^{th}$ combined code word and that are sorted by channel capacity in ascending order, the $i^{th}$ combined code word is generated by combining the $i^{th}$ code word and an $(i-1)^{th}$ combined code word, wherein i=2, 3, . . . , k, a $1^{st}$ combined code word is the $1^{st}$ code word, k is a maximum quantity of retransmissions, q is a positive integer not greater than n, and both the $i^{th}$ code word and the $(i+1)^{th}$ code word are polar-coded code words.

15. The device according to claim 14, wherein a length of the $1^{st}$ code word is equal to that of the $2^{nd}$ code word, and a length of the $(i+1)^{th}$ code word is twice that of the $i^{th}$ code word.

16. The device according to claim 14, wherein each frozen bit in the $1^{st}$ code word to the $(i+1)^{th}$ code word carries a preset value, and the frozen bit is a bit other than information bits in the $1^{st}$ code word to the $(i+1)^{th}$ code word.

17. The device according to claim 14, wherein the programming instructions instruct the processor to:

perform channel estimation on an $(i+1)^{th}$ combined code word to obtain polarization channel capacity distribution of the $(i+1)^{th}$ combined code word, wherein the $(i+1)^{th}$ combined code word is generated by combining code words from the $(i+1)^{th}$ code word to the $1^{st}$ code word in descending order;

select, from bits sorted by channel capacity in ascending order in the $1^{st}$ information bits to $i^{th}$ information bits, first q bits as $i^{th}$ target bits;

select, from bits of the $(i+1)^{th}$ code word that are sorted by channel capacity in descending order, first q bits as the $(i+1)^{th}$ information bits;

copy user data carried in each $i^{th}$ target bit to a corresponding $(i+1)^{th}$ information bit; and set data carried by each frozen bit in the $(i+1)^{th}$ code word to a preset value, wherein a frozen bit in the $(i+1)^{th}$ code word is a bit other than the $(i+1)^{th}$ information bits in the $(i+1)^{th}$ code word.

18. The device according to claim 14, wherein the programming instructions instruct the processor to:

perform channel estimation on a $(k+1)^{th}$ combined code word to obtain polarization channel capacity distribution of the $(k+1)^{th}$ combined code word, wherein the $(k+1)^{th}$ combined code word is generated by combining code words from a $(k+1)^{th}$ code word to the $1^{st}$ code word in descending order;

write the user data into n bits with largest channel capacity in the $(k+1)^{th}$ combined code word;

successively copy, to target bits corresponding to to-be-copied bits, data carried by the to-be-copied bits in code words from the $(k+1)^{th}$ code word to the $2^{nd}$ code word, wherein to-be-copied bits in a $j^{th}$ code word comprise bits carrying user data in the $j^{th}$ code word, the target bits comprise bits with largest channel capacity, excluding bits carrying user data, in a $(j+1)^{th}$ combined code word, and j=2, 3, . . . , k+1; and set data carried by each frozen bit in the $(k+1)^{th}$ combined code word to a preset value, wherein a frozen bit in the $(k+1)^{th}$ combined code word is a bit other than the bits carrying the user data in the $(k+1)^{th}$ combined code word.

19. A device comprising
a processor; and
a non-transitory computer-readable storage medium coupled to the processor and storing programming instructions for execution by the processor, the programming instructions instruct the processor to:

receive a $1^{st}$ polar-coded code word, wherein the $1^{st}$ code word comprises $1^{st}$ information bits carrying user data, and the $1^{st}$ information bits comprise first n bits in bits of the code word that are sorted by channel capacity in descending order;

decode the $1^{st}$ code word;

receive a $2^{nd}$ code word if an error occurs in decoding the $1^{st}$ code word, wherein the $2^{nd}$ code word comprises p $2^{nd}$ information bits carrying user data, each $2^{nd}$ information bit carries same user data as one corresponding $1^{st}$ retransmission bit, the $2^{nd}$ 2 information bits comprise first p bits in bits of the code word that are sorted by channel capacity in descending order, the $1^{st}$ retransmission bits comprise first p bits in the $1^{st}$ information bits sorted by channel capacity in ascending order, n is a positive integer, and p is a positive integer not greater than n;

decode a $2^{nd}$ combined code word, wherein the $2^{nd}$ combined code word is generated by combining the $2^{nd}$ code word and the $1^{st}$ code word; and obtain user data from a decoding result obtained by decoding the $2^{nd}$ combined code word.

20. The device according to claim 19, wherein the programming instructions instruct the processor to:

receive an $(i+1)^{th}$ code word if an error occurs in decoding an $i^{th}$ code word, wherein the $(i+1)^{th}$ code word comprises q $(i+1)^{th}$ information bits carrying user data, each $(i+1)^{th}$ information bit carries same user data as one corresponding $i^{th}$ retransmission bit, the $(i+1)^{th}$ information bits comprise first q bits in bits of the code word that are sorted by channel capacity in descending order, the $i^{th}$ retransmission bits comprise first q bits in bits that carry user data in an $i^{th}$ combined code word and that are sorted by channel capacity in ascending order, the $i^{th}$ combined code word is generated by combining the $i^{th}$ code word to the $1^{st}$ code word, wherein i=2, 3, . . . , k, k is a maximum quantity of retransmissions, and q is a positive integer not greater than n;

decode an $(i+1)^{th}$ combined code word, wherein the $(i+1)^{th}$ combined code word is generated by combining code words from the $(i+1)^{th}$ code word to the $1^{st}$ code word; and obtain user data from a decoding result obtained by decoding the $(i+1)^{th}$ combined code word, wherein both the $i^{th}$ code word and the $(i+1)^{th}$ code word are polar-coded code words.

21. The device according to claim 20, wherein a length of the $1^{st}$ code word is equal to that of the $2^{nd}$ code word, and a length of the $(i+1)^{th}$ code word is twice that of the $i^{th}$ code word.

22. The device according to claim 20, wherein the programming instructions instruct the processor to:

when a to-be-decoded bit is a $1^{st}$ to-be-decoded bit, determine a decoding result of the $1^{st}$ to-be-decoded bit based on a decoding result of a $2^{nd}$ to-be-decoded bit, wherein the $1^{st}$ to-be-decoded bit is one of $i^{th}$ information bits, the $2^{nd}$ to-be-decoded bit is one of information bits from the $(i+1)^{th}$ information bits to $(k+1)^{th}$ information bits, and the $1^{st}$ to-be-decoded bit carries same data as the $2^{nd}$ to-be-decoded bit.

23. The device according to claim 22, wherein the programming instructions instruct the processor to:
when a decoding manner used for decoding the $(i+1)^{th}$ combined code word is successive cancellation decoding, use the decoding result of the $2^{nd}$ to-be-decoded bit as the decoding result of the $1^{st}$ to-be-decoded bit.

24. The device according to claim 22, wherein the programming instructions instruct the processor to:
when a decoding manner used for decoding the $(i+1)^{th}$ combined code word is list decoding, select same decision branches of a survivor path generated in a process of decoding the $2^{nd}$ to-be-decoded bit, and calculate a branch metric of each same decision branch, to determine the decoding result of the $1^{st}$ to-be-decoded bit.

* * * * *

UNITED STATES PATENT AND TRADEMARK OFFICE
CERTIFICATE OF CORRECTION

PATENT NO. : 10,826,651 B2
APPLICATION NO. : 16/183187
DATED : November 3, 2020
INVENTOR(S) : Liang Ma et al.

It is certified that error appears in the above-identified patent and that said Letters Patent is hereby corrected as shown below:

In the Claims

In Column 19, Line 15, Claim 6, delete "$(j+1)^{th}$" and insert --$(j-1)^{th}$--.

In Column 21, Line 64, Claim 18, delete "$(j+1)^{th}$" and insert --$(j-1)^{th}$--.

In Column 22, Lines 20-21, Claim 19, delete "the $2^{nd}$ 2 information" and insert --the $2^{nd}$ information--.

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*